(12) United States Patent
Kleemann et al.

(10) Patent No.: US 10,497,888 B2
(45) Date of Patent: Dec. 3, 2019

(54) METHOD FOR PRODUCING AN ORGANIC TRANSISTOR AND ORGANIC TRANSISTOR

(71) Applicant: Novaled GmbH, Dresden (DE)

(72) Inventors: Hans Kleemann, Dresden (DE); Gregor Schwartz, Dresden (DE); Jan Blochwitz-Nimoth, Dresden (DE)

(73) Assignee: Novaled GmbH, Dresden (DE)

( * ) Notice: Subject to any disclaimer, the term of this patent is extended or adjusted under 35 U.S.C. 154(b) by 65 days.

(21) Appl. No.: 15/129,735

(22) PCT Filed: Mar. 27, 2015

(86) PCT No.: PCT/EP2015/056674
§ 371 (c)(1),
(2) Date: Sep. 27, 2016

(87) PCT Pub. No.: WO2015/144865
PCT Pub. Date: Oct. 1, 2015

(65) Prior Publication Data
US 2017/0149001 A1  May 25, 2017

(30) Foreign Application Priority Data
Mar. 28, 2014  (EP) .................................... 14162388

(51) Int. Cl.
*H01L 51/05* (2006.01)
*H01L 51/10* (2006.01)
*H01L 51/00* (2006.01)

(52) U.S. Cl.
CPC ........ *H01L 51/057* (2013.01); *H01L 51/0003* (2013.01); *H01L 51/0023* (2013.01); *H01L 51/105* (2013.01); *H01L 51/0541* (2013.01)

(58) Field of Classification Search
CPC .......................... H01L 51/057; H01L 27/283
(Continued)

(56) References Cited

U.S. PATENT DOCUMENTS 5,742,401 A * 4/1998 Bringley .................. B41M 5/24
346/135.1
9,660,206 B2  5/2017 Fischer et al.
(Continued)

FOREIGN PATENT DOCUMENTS

WO   2005/091376 A1   9/2005
WO   2013/041822 A1   3/2013

OTHER PUBLICATIONS

PCT International Search Report and Written Opinion for PCT Application No. PCT/EP2015/056674 dated Jun. 26, 2015.
(Continued)

*Primary Examiner* — Nilufa Rahim
(74) *Attorney, Agent, or Firm* — Eversheds Sutherland (US) LLP

(57) ABSTRACT

The invention refers to a method for producing an organic transistor, the method comprising steps of providing a first electrode (2) on a substrate (1), generating a source-drain insulator (3) assigned at least partially to the substrate (1) and/or at least partially to the first electrode (2), generating a second electrode (4) assigned to the source-drain insulator (3), depositing an organic semiconducting layer (5) on the first electrode (2), the second electrode (4), and the source-drain insulator (3), generating a gate insulator (6) assigned to the organic semiconducting layer (5), and providing a gate electrode (7) assigned to the gate insulator (6). Further, the invention relates to an organic transistor.

15 Claims, 11 Drawing Sheets

Figure 1:
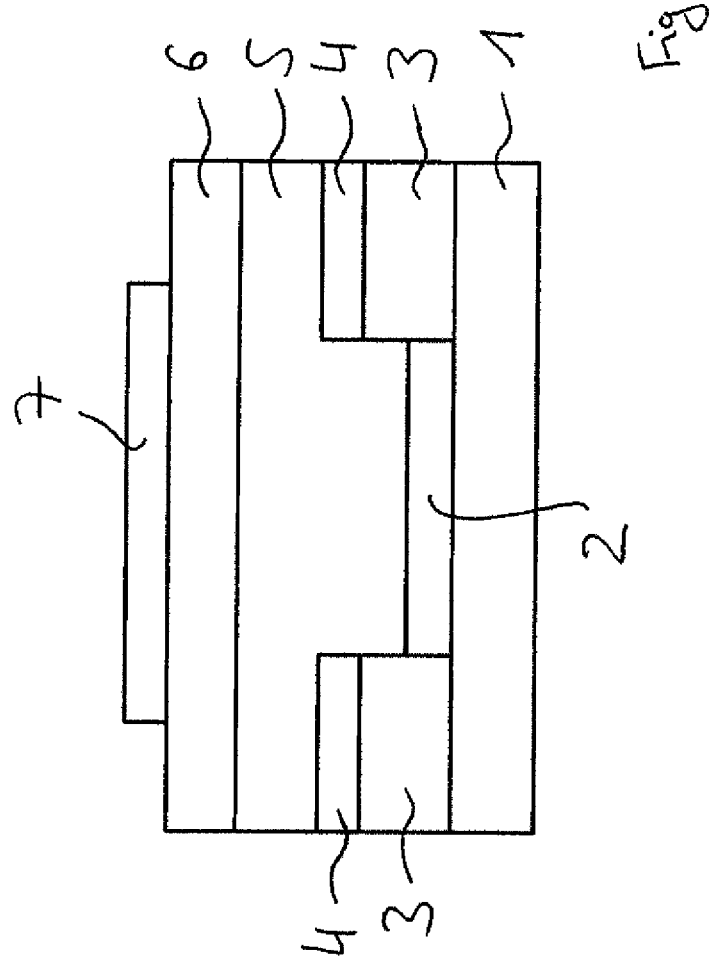

(58) Field of Classification Search
USPC .......................................................... 257/40
See application file for complete search history.

(56) References Cited

U.S. PATENT DOCUMENTS

| | | | |
|---|---|---|---|
| 9,722,196 B2 | 8/2017 | Zakhidov et al. | |
| 2007/0082438 A1 | 4/2007 | Li et al. | |
| 2007/0158647 A1* | 7/2007 | Chen | H01L 51/057 257/40 |
| 2007/0254402 A1 | 11/2007 | Dimmler et al. | |
| 2011/0024728 A1* | 2/2011 | Burroughes | H01L 51/002 257/40 |
| 2013/0245282 A1* | 9/2013 | Takeya | H01L 51/0074 549/41 |
| 2014/0225101 A1* | 8/2014 | Burroughes | H01L 51/0074 257/40 |
| 2016/0049603 A1* | 2/2016 | Kleemann | H01L 51/002 257/40 |

OTHER PUBLICATIONS

European Search Report for EP Application No. 14162388.4 dated Sep. 15, 2014.
Parashikov et al., "Vertical Channel All-Organic Thin-Film Transistors," Applied Physics Letters, 2003, 82 (25):4579-4580.
Chinese Office Action for CN Application No. 201580023349.X dated Jun. 5, 2018 (9 pages) (English translation).

\* cited by examiner

METHOD FOR PRODUCING AN ORGANIC TRANSISTOR AND ORGANIC TRANSISTOR

CROSS REFERENCE TO RELATED APPLICATIONS

This application is a U.S. national stage application of PCT/EP2015/056674, filed Mar. 27, 2015, which claims priority to European Application No. 14162388.4, filed Mar. 28, 2014. The content of these applications is hereby incorporated by reference.

The invention relates to a method for producing an organic transistor and an organic transistor.

BACKGROUND

A vertical organic field effect transistor (VOFET) (as field effect transistors in general) is formed with three electrodes, namely a gate electrode, a source electrode and a drain electrode. In a VOFET, the source electrode and the drain electrode are connected with each other by an organic semiconductor. The gate electrode is separated from the source electrode and the drain electrode by an insulator.

VOFETs are considered as potential devices for AMO-LED (AMOLED—active-matrix organic light-emitting diode) backplane technology. Owing to their vertical channel geometry vertical transistor concepts are supposed to be superior to horizontal thin-film transistors (OTFT) since they are offering a high on-state current. However, a sufficient on/off-ratio, a reduced sensitivity to the particular properties of the insulator material, larger performance stability and an improved uniformity are still to be shown. Moreover, VOFETs require a complex fabrication protocol which might limit their field of applications and the exploitation in total.

Hence, there is a particular interest in having VOFETs with a high on-current density, a high on/off ratio, a large degree of operational stability and uniformity and a simple fabrication protocol being compatible to mass production techniques.

The known VOFETs have the following layer sequence: substrate/gate electrode/insulator/source electrode/drain electrode, the so-called bottom gate architecture. In such design, a k-high insulator can be used as a gate insulator and the gate can be patterned by state-of-the-art photolithography. However, there are also several drawbacks in this layout. In order to achieve a high-resolution as e.g. required for display applications, a fast and reliable patterning technique is required. This architecture, however, requires a structuring of source and drain electrode on the organic semiconductor material. Even if this can in principle be made by shadow masks, a high resolution technique such as photo-lithography is required for backplane transistors. However, photo-lithography on organic semiconductor materials has a limited freedom of processing. In particular, etching recipes are barely applicable owing to the sensitivity of the organic material. Lift-off processes—the alternative to etching—are not desired by the microelectronic industry owing to the low yield, the limited resolution and the duration.

The document WO 2010/113163 A1 discloses a vertical organic field effect transistor and a method for producing the same. The transistor comprises a patterned electrode structure which is enclosed between a dielectric layer and an active element. The active element is either an organic semiconductor. The electrode structure is patterned by using a block copolymer material as a patterning mask. Hereby, the thickness of the patterned layer and lateral feature size can be selected. However, device described in the document WO 2010/113163 A1 are patterned by shadow masks and a special self-assembling process and are therefore not compatible to mass productions processes such as photolithography and etching.

A method for forming an organic device having a patterned conductive layer is disclosed in document WO 2011/139774. The method comprises the steps of depositing an organic layer on a substrate and coating the organic layer with a photoresist solution to form a photo-patternable layer. The photoresist solution includes a fluorinated photoresist material and a fluorinated solvent. Selected portions of the photo-patternable layer are radiated to form a pattern. A conductive layer is coated over the organic layer. A portion of the conductive layer is removed to form a patterned conductive layer. This particular method disclosed in document WO 2011/139774 enables photolithography on organic semiconductors. However, in order to pattern e.g. a metal layer on top of the organic semiconductor either lift-off or etching have to be used. Lift-off and etching have been demonstrated on organic semiconductor. However, both processes are not compatible to mass production because of low process yield.

K. Nakamura et al., Applied Physics Letters Vol. 89, page 103525 (2006) discloses a vertical organic light emitting transistor. A gate electrode is arranged on a substrate and covered by a gate insulating layer. A semiconducting layer is coated on the gate insulating layer. A source electrode, an insulating layer, and a hole transporting layer are arranged on the semiconducting layer. Further, the transistor comprises an emitting layer and a drain electrode. In this way a vertical type organic light-emitting transistor is generated. However, also these devices are hardly compatible with mass production since they require shadow mask patterning which cannot be adopted for small structures as required in microelectronics.

Kleemann et al. disclosed in document WO 2013/149947 A1 a vertical organic transistor integrated by photolithography. However, even if photolithography, lift-off and etching can be performed on organic semiconductor materials as shown in this document, such processes are not desired in mass production because of the natural chemical and mechanical sensitivity of organic semiconductors.

SUMMARY

It is an object to provide improved technologies for organic transistors. There is a need to provide a transistor design which allows high current densities in the device and a method for producing such transistor in an easy and controllable manner.

This object is solved by the method for producing an organic transistor according to the independent claim 1 and the organic transistor according to the independent claim 14. Further embodiments are the subject of dependent claims.

According to one aspect, a method for producing an organic transistor is provided. The method comprises steps of: providing a first electrode on a substrate, generating a source-drain insulator assigned at least partially to the substrate and/or at least partially to the first electrode, generating a second electrode assigned to the source-drain insulator, depositing an organic semiconducting layer on the first electrode and the second electrode, generating a gate insulator assigned to the organic semiconducting layer, and providing a gate electrode assigned to the gate insulator.

In another aspect, an organic transistor is provided, comprising: a first electrode on a substrate, a source-drain insulator assigned at least partially to the substrate and/or at least partially to the first electrode, a second electrode assigned to the source-drain insulator, an organic semiconducting layer arranged on the first electrode and the second electrode, a gate insulator assigned to the organic semiconducting layer, and a gate electrode assigned to the gate insulator.

An organic transistor in so-called top-gate design is provided. The top-gate design advantageously is compatible to mass production techniques for a pattering of source and drain electrode, for example by photo-lithography and etching. It is therefore compatible to state-of-the-art backplane processes as used in flat panel industry. Moreover, the gate insulator can act as a degradation barrier for the organic semiconducting material since the insulator material is on top of the organic material.

In the configuration of electrodes as described above, the first electrode can act as the drain electrode of the transistor while the second electrode can act as the source electrode. Also the first electrode can be used as the source electrode while in this case the second electrode is the drain electrode of the transistor.

In this application a layer A being assigned to a layer B can mean that the layer A is in contact with layer B. For example, the layers A and B are in direct contact with each other. In one embodiment, layer A is at least partially on top of layer B. Layers A and B can be all components of the transistor.

The drain and source electrode each provides a contact for applying a voltage to the transistor. The gate electrode provides a contact for controlling the state of the transistor. The transistor can be a vertical transistor. Further, the transistor can be a thin film transistor. The first electrode (at least partially or completely) can be in direct contact with the substrate. Further, the source-drain insulator (at least partially or completely) can be in direct contact with the substrate.

The method may further comprise a step of generating a second-electrode layer assigned to the second electrode prior to depositing the organic semiconducting layer such that the second electrode is at least partially covered by the second-electrode layer. The method may further comprise a step of generating a first-electrode layer assigned to the first electrode prior to depositing the organic semiconducting layer such that the first electrode is least partially covered by the first-electrode layer. The second-electrode layer and/or the first-electrode layer can be a doping layer or an injection improving layer, respectively.

In one embodiment, the second-electrode layer and/or the first-electrode layer, for example each being a doping layer, are generated by physical vapor deposition, in particular by thermal evaporation. Hereby, the step of generating the second-electrode and/or first-electrode layer can be integrated in known production processes in a simple manner.

In another embodiment, the second-electrode layer and/or the first-electrode layer, for example each being an injection improving layer, are generated by solution processing.

The second-electrode layer and/or the first-electrode layer may comprise a dopant material. The second-electrode layer and/or the first-electrode layer may comprise a matrix material. The matrix material can be an organic semiconducting material.

In one embodiment, the first-electrode layer being a first doping layer and/or the second-electrode layer being a second doping layer can be made of a pure dopant material, respectively. The first doping layer and the second doping layer can be made of the same pure dopant material. Alternatively, both doping layers can be made of different pure dopant materials.

The first doping layer and/or the second doping layer may comprise a matrix material including a dopant material, respectively. The first doping layer and the second doping layer can comprise the same matrix material including the same dopant material. Alternatively, both doping layers can comprise the same matrix material including different dopant materials. In another alternative, both doping layers can comprise different matrix materials with either the same or different dopant materials. In the first and/or second doping layer comprising a matrix material and a dopant material, the dopant material may exist in a ratio of less than 5 mol % in the layer, preferably less than 2 mol %. The matrix material(s) used in the doping layer(s) can be the same as the material of the organic semiconducting layer or can be different from the material of the organic semiconducting layer. The material of the doping layer(s) may have a lower charge carrier mobility than the material of the organic semiconducting layer.

The dopants used for generating the first and/or second doping layers, either as pure dopant material or in a matrix/dopant system, can be small organic molecules.

In one embodiment, the first-electrode layer being a first injection improving layer and/or the second-electrode layer being a second injection improving layer can be made of a self-assembling material providing a selective attachment to the drain and/or source electrode, respectively.

The first-electrode layer and/or the second-electrode layer can have a thickness of equal to or less than 5 nm, preferably equal to or less than 2.5 nm, and more preferably equal to or less than 1 nm.

The organic semiconducting layer can be configured to transport charge carriers of the same type, namely holes and electrons. In a hole transport layer (HTL) the mobility of holes is larger than the mobility of electrons. In an electron transport layer (ETL) the mobility of electrons is larger than the mobility of holes.

The organic semiconducting layer may be doped. A doped layer comprises a matrix material and at least one dopant. The doped layer may be made of the matrix material and at least one dopant, preferentially of more than 90 mol % of the matrix material, even more preferable of more than 95 mol %.

The organic semiconducting layer can consist of several sub-layers. At least one of the sub-layers can be doped. In one embodiment, one of the sub-layers can be made completely of a matrix material without a dopant material. The individual sub-layers may or may not comprise the same organic matrix material.

The organic semiconductor layer can be deposited e.g. in vacuum by thermal evaporation or by organic vapor phase printing or from solution by e.g. spin-coater, printing, or drop-casting.

In one embodiment, the organic semiconducting layer and the sub-layers, if applicable, can be made of a small molecule material. The organic semiconducting layer and the sub-layers, if applicable, can be made of a polymeric material.

According to a one embodiment, a current path formed between the source and drain electrodes via the organic semiconducting layer may be unipolar. Thus, the current through the layer may be provided by only one type of charge carriers, namely electrons or holes.

At least one of the following steps may comprise a step of photo-lithographic structuring: the step of providing the first electrode, the step of generating the source-drain insulator, the step of generating the second electrode, the step of generating the second-electrode layer, and the step of generating the first-electrode layer. With photo-lithographic structuring the edge width can be maximized while using a technically well controllable procedure. The edge length is defined by the thickness of the source-drain insulator (e.g. the length between the first electrode and the second electrode). The edge width may refer to a horizontal extension of the edges. A high performance device can be provided without requiring sophisticated lithography equipment. Common equipment with resolution and alignment registry of about 1 µm is more than sufficient to produce the transistor. Preferably, the first-electrode and/or second-electrode layer can be generated after structuring the source and drain electrode, respectively, but before depositing the organic semiconductor material. In principle, this may be realized by a shadow masking process.

The first electrode can be generated with first sub-electrode portions and the second electrode can be generated with second sub-electrode portions, the plurality of sub-electrode portions being arranged in separated groups of overlapping sub-electrode portions, wherein each of the separated groups of overlapping sub-electrode portions can be generated with at least one first sub-electrode portion overlapping with at least one second sub-electrode portion. The sub-electrode portions of both electrodes may have a correspondence: either a one-to-one correspondence if the overlap area is larger than the non-overlapping area, or a one-to-one or a one-to-two neighboring (where the end can be even or odd) if the overlap area is smaller than the non-overlapping area. In the first case, the width of the sub-electrode of the drain electrode is preferentially larger than the width of sub-electrode of the sub-electrode of the source electrode. Each of the at least one first sub-electrode portion and the at least one second sub-electrode portion is separated from a respective adjacent sub-electrode portion. Further, the at least one first sub-electrode portion and the at least one second sub-electrode portion may have different widths.

Preferentially, the sub-electrodes portions of both electrodes are arranged parallel to each other. Hereby, the optimum of lowest capacitance while keeping the series resistance low is provided.

The step of providing the first electrode may comprise steps of: depositing a first conductive layer on the substrate, depositing a first photoresist layer on the first conductive layer, defining an electrode area for the first electrode by patterning the first photoresist layer, thereby providing a first photoresist pattern, etching the first conductive layer, and removing the first photoresist pattern by e.g. plasma etching or by solving the first photoresist in a solvent, thereby generating the first electrode. Alternatively, the step of providing the first electrode may comprise steps of: depositing a first photoresist layer on the substrate, defining an electrode area for the first electrode by patterning the first photoresist layer, thereby providing a first photoresist pattern, depositing a first conductive layer on the first photoresist layer and the substrate, removing the first photoresist pattern and partially the conductive layer by a lift-off process, thereby defining the first electrode.

The step of generating the second electrode may comprise steps of: depositing a first insulating layer and a second conductive layer on the substrate which is at least partially covered by the first electrode, depositing a second photoresist layer on the second conductive layer, defining an electrode area for the second electrode by patterning the second photoresist layer, thereby providing a second photoresist pattern, etching the second conductive layer and the first insulating layer, removing the second photoresist pattern, thereby defining the second electrode. In an alternative embodiment, the step of generating the second electrode may comprise steps of: depositing a first insulating layer and a second conductive layer on the substrate which is at least partially covered by the first electrode, depositing a second photoresist layer on the second conductive layer, defining an electrode area for the second electrode by patterning the second photoresist layer, thereby providing a second photoresist pattern, etching the second conductive layer, removing the second photoresist pattern thereby defining the second electrode and etching the first insulating layer. In an alternative embodiment, the step of generating the second electrode may comprise steps of: depositing a second photoresist layer on the first insulating layer, defining an electrode area for the second electrode by patterning the second photoresist layer, thereby providing a second photoresist pattern, depositing a second conductive film on the second photoresist layer and on the first insulating layer, removing the second photoresist pattern and at least partially the second conductive layer by a lift-off process, thereby defining the second electrode, and etching the first insulating layer.

In an alternative embodiment, the steps of generating the source-drain insulator and the second electrode may comprise steps of: depositing a second photoresist layer on the first insulating layer, defining an electrode area for the second electrode by patterning the second photoresist layer, thereby providing a second photoresist pattern, depositing a first insulating film and a second conductive film on the second photoresist layer, removing the second photoresist pattern and at least partially the second conductive layer and the first insulating layer by a lift-off process, thereby defining the second electrode and the source-drain insulator.

The steps of providing the gate insulator and generating the gate electrode may comprise steps of: depositing a second insulating layer and a third conductive layer on the organic semiconducting layer, depositing a third photoresist layer on the third conductive layer, defining an electrode area for the gate electrode by patterning the third photoresist layer, thereby providing a third photoresist pattern, etching the second insulating layer and/or the third conductive layer, and removing the third photoresist pattern, thereby defining the gate electrode and the gate insulator. In an alternative embodiment, the step of providing the gate electrode may comprise steps of: depositing a second insulating layer on the organic semiconducting layer, depositing a third photoresist layer, defining an electrode area for the gate electrode by patterning the third photoresist layer, thereby providing a third photoresist pattern, depositing a third conductive layer on the third photoresist layer and on the second insulating layer, removing the third photoresist pattern and at least partially the third conductive layer by a lift-off process, thereby defining the gate electrode. Alternatively, the step of providing the gate electrode may comprise steps of: depositing a third photoresist layer on the semiconducting layer, patterning the third photoresist layer, thereby providing a third photoresist pattern, defining an electrode area for the gate electrode, depositing a second insulating layer and a third conductive layer on the organic semiconducting layer, removing the third photoresist pattern and at least partially the second insulating and at least partially the third conductive layer by a lift-off process, thereby defining the gate electrode.

In still a further embodiment, the first electrode and at least one of the gate electrode and the second electrode are opaque for light. This ensures that ambient light does not affect the performance of the transistor.

According to a further embodiment, at least one electrode selected from the following group is made of a metal material: the second electrode, the first electrode, and the gate electrode. The metal material may be gold, silver, copper or aluminum. Electrodes made of a metal material have a low resistance while a high power with a high frequency may be applied.

The step of generating the source-drain insulator can comprise an anisotropic etching step.

The step of depositing the organic semiconducting layer may comprise a deposition from solution.

The step of generating the gate insulator layer may comprise a deposition from solution.

The source-drain insulator edge may essentially orthogonal to the substrate. An angle between the source-drain insulator edge and the substrate may be equal to or larger than 85°, preferably equal to or larger than 88°, more preferably 90°.

The gate insulator may be essentially as thick as the source-drain insulator. By producing the gate-insulator, a typical thickness profile of the gate insulator may be created. The gate insulator may be thinner in a region on the second electrode. Further, the gate insulator may be thinner in on an edge of the source-drain insulator. In a further embodiment, the gate insulator may be thinner than the source-drain insulator. A gate insulator with a thickness profile which is thinned at the edge of the source-drain insulator may be beneficial for the switching characteristic of the transistor. Providing a gate insulator which is thicker than the source-drain insulator may be disadvantageous for the switching characteristic of the transistor. In one embodiment, the source-drain insulator may be surrounded by the gate insulator to provide an electrical insulation.

The dopant material can be an electrical dopant. The electrical dopant material can be applied to any doped layer disclosed herein, in particular the first and second doping layer, the first and second injection improving layer and the organic semiconducting layer (including its sub-layers). Electrical dopants are classified in p-dopants and n-dopants. Electrical doping is well known in the field, exemplary literature references are Gao et al, Appl. Phys. Lett. V. 79, p. 4040 (2001), Blochwitz et al, Appl. Phys. Lett. V. 73, p. 729 (1998), D'Andrade et al. App. Phys. Let. V. 83, p. 3858 (2003), Walzer et al. Chem. Rev. V. 107, p. 1233 (2007), U.S. 2005/040390 A1, U.S. 2009/179189 A1.

Exemplary p-dopants are: tetrafluoro-tetracyanoquinonedimethane (F4TCNQ); 2,2'-(perfluoronaphthalene-2,6-diylidene) dimalononitrile (F6TCNNQ); 2,2',2"-(cyclopropane-1,2,3-triylidene)tris(2-(p-cyanotetrafluorophenyl) acetonitrile). Preferred compounds are organic molecules containing cyano groups.

Exemplary n-dopants are: acridine orange base (AOB); tetrakis (1,3,4,6,7,8-hexahydro-2H-pyrimido [1,2-a]pyrimidinato) ditungsten (II) (W2(hpp)4); 3,6-bis-(dimethyl amino)-acridine; bis(ethylene-dithio) tetrathiafulvalene (BEDT-TTF).

Preferred p-type semiconductors for the organic semiconducting layer and/or the doping layer(s) (if provided as matrix/dopant system) are: pentacene, dinaphthothienothiophene (DNTT), further DNTT derivatives such as C10-DNTT (in general Cx-DNTT), Metal-Phthalocyanines (ZnPc,CuPc), perylenes such as Diindenoperylenes (DIP), Tetrapropyl-tetraphenyl-diindenoperylene (P4-PH4-DIP), (PBTTT) Poly[2,5-bis(3-tetradecylthiophen-2-yl)thieno[3,2-b]thiophene], (PQT) poly(3,3'''-dialkyl-quaterthiophene).

Preferred n-type semiconductors for the organic semiconducting layer and/or the doping layer(s) (if provided as matrix/dopant system) are: C60, C70, ZnPc, CuPc, F16CuPc, F4CuPc, Diindenoperylenes, ((P(NDI2OD-T2)) poly {[N,N9-bis(2-octyldodecyl)-naphthalene-1,4,5,8-bis (dicarboximide)-2,6-diyl]-alt-5,59-(2,29-bithiophene)}. The matrix material in a doped layer can be TPD=triphenyldiamine, MPB=3-(N-Maleimidopropionyl)-biocytin, BPHEN=athophenanthroline, TPHEN=2,4,7,9-tetraphenyl-1,10-phenanthroline or PTCDA=perylene-3,4,9,10-tetracarboxylie-3,4,9,10-dianhydride, NTCDA=naphthalenetetracarboxylicaciddi-anhydride etc.

The material for the injection improving layer(s) may be a self-assembling material or a dopant. Self-assembling materials for charge carrier injection are e.g. tetrafluorotetracyanoquinonedimethane (F4TCNQ); 2,2',2"-(perfluoronaphthalene-2,6-diylidene) dimalononitrile (F6TCNNQ); 2,2',2"-(cyclopropane-1,2,3-triylidene)tris(2-(p-cyanotetrafluorophenyl)-acetonitrile) deposited from solution. Further materials are: Pentafluorobenzenethiol (PFBT); Pentachlorobenzenethiol (PCIBT); Nitrothiophenol (NTP); 2,3,5,6-tetrafluoro-4-mercapto-benzonitrile (CN-PFBT); tetrafluoro-tetracyanoquinonedimethane-triazol (F4-Triazol). The first and/or second injection improving layer may contain a specific side group for a chemical adhesion to a specific metal. In particular thiol side-chains are used for adhesion to gold, silver, palladium, platin and other noble metals.

According to another embodiment, an electronic switching device comprising an organic transistor is provided.

It is preferred that the first electrode, the second electrode, and/or the source-drain insulator are not permeable. The first electrode, the second electrode and/or the source-drain insulator can be thick enough to form closed layers, respectively. Preferentially, the first electrode, the second electrode and/or the source-drain insulator are not interrupted, perforated or randomly interrupted, but rather lithographically patterned, respectively. Also, the source-drain insulator does not allow any substantial tunneling of charge carriers through it under normal operating conditions.

In another embodiment, a circuit is provided comprising:
at least a n-type VOFET comprising a n-type material and
at least a p-type VOFET comprising a p-type material.

Layers forming the electrodes can be shared between the n-type and p-type VOFET. The polarity of the VOFET may only be chosen by the polarity of the dopant (p or n). In this case the organic semiconductor material of p- or n-type VOFET may be the same.

The photolitographic patterning procedure for VOFETs may comprise:
depositing a fluorine based photoresist over the semiconducting layer;
depositing a (non-fluorine based) photoresist over the fluorine based photoresist layer;
illuminating (exposing) the fluorine and the non-fluorine based photoresist layer;
developing the non-fluorine based photoresist pattern;
developing the fluorine based photoresist pattern;
depositing an additional organic or inorganic layer on top of the then patterned photoresist layer;

patterning the additional organic or inorganic layer by lift-off of the fluorin based and non-fluorine based photoresist;

depositing the (non-fluorine based) photoresist layer;

illuminating (exposing non-fluorine based photoresist layer;

developing the non-fluorine based photoresist pattern;

depositing an additional organic or inorganic layer on top of the patterned photoresist layer;

etching a organic or inorganic layer underneath the photoresist layer; and stripping the spare photoresist.

All steps can be done at atmospheric pressure.

Several advantages are provided, for instance the method described herein allows for a reduction of overlap capacitances. Injection can be easily improved. Higher current densities are possible even at higher frequencies. In some embodiments, the high current can be further increased in asymmetrical devices by doping at least one of the contacts. The photolithographic patterning allows the precise alignment and hence control of electronic device parameters. It enables the fabrication of complementary circuits (using n- and p-channel transistors). Also transistors can easily be made with gain of 10 times, 20 times or higher than conventional planar thin-film transistors having high on/off ratio of more than $10^5$.

All features disclosed in context of the method can also be applied to the transistor and vice versa.

DESCRIPTION OF EXEMPLARY EMBODIMENTS

Figure 2:
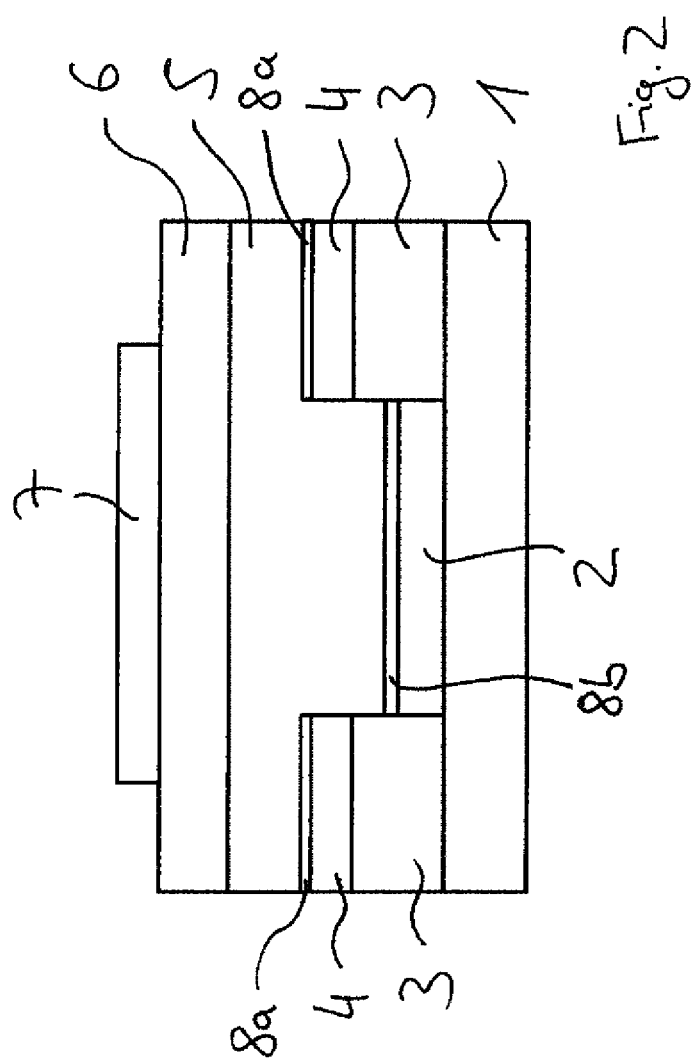
Figure 3:
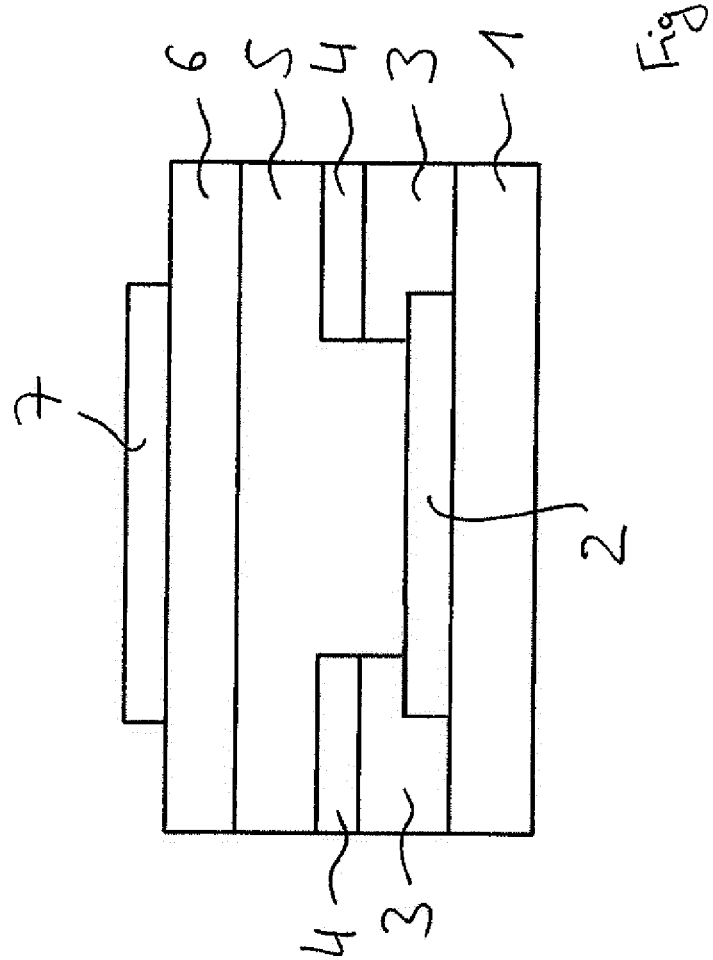
Figure 4:
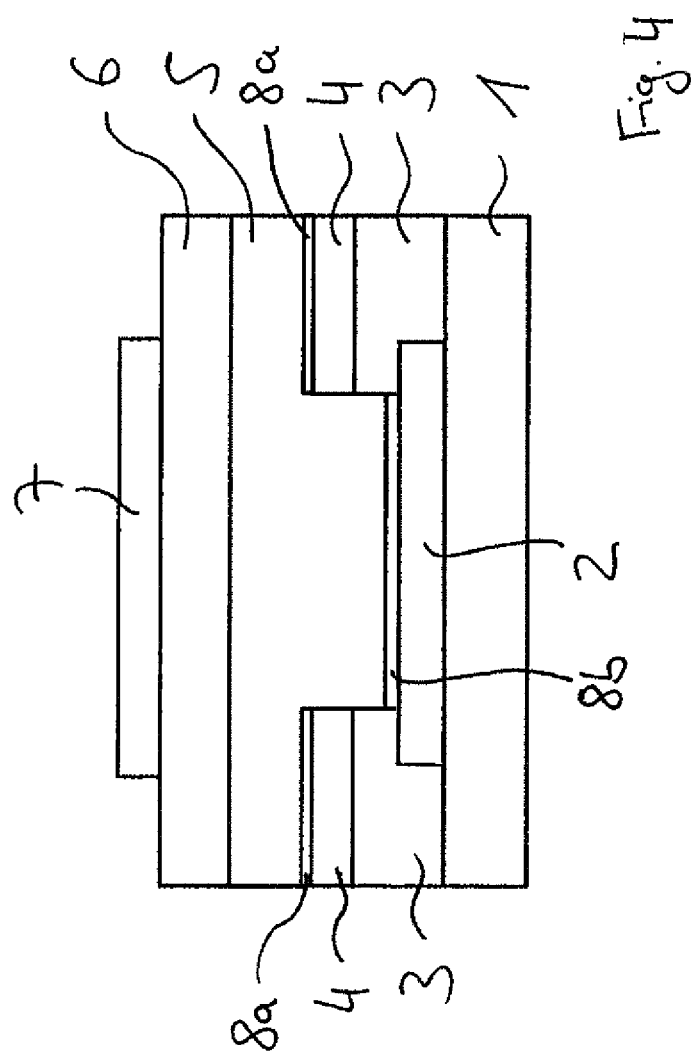
Figure 5:
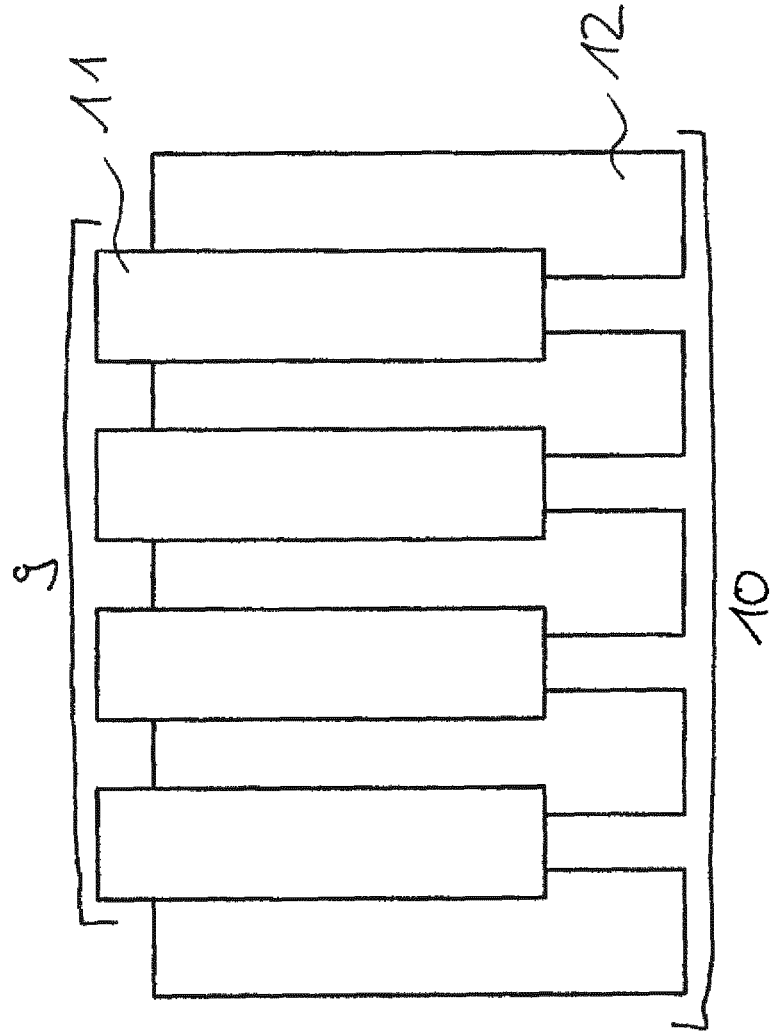
Figure 6:
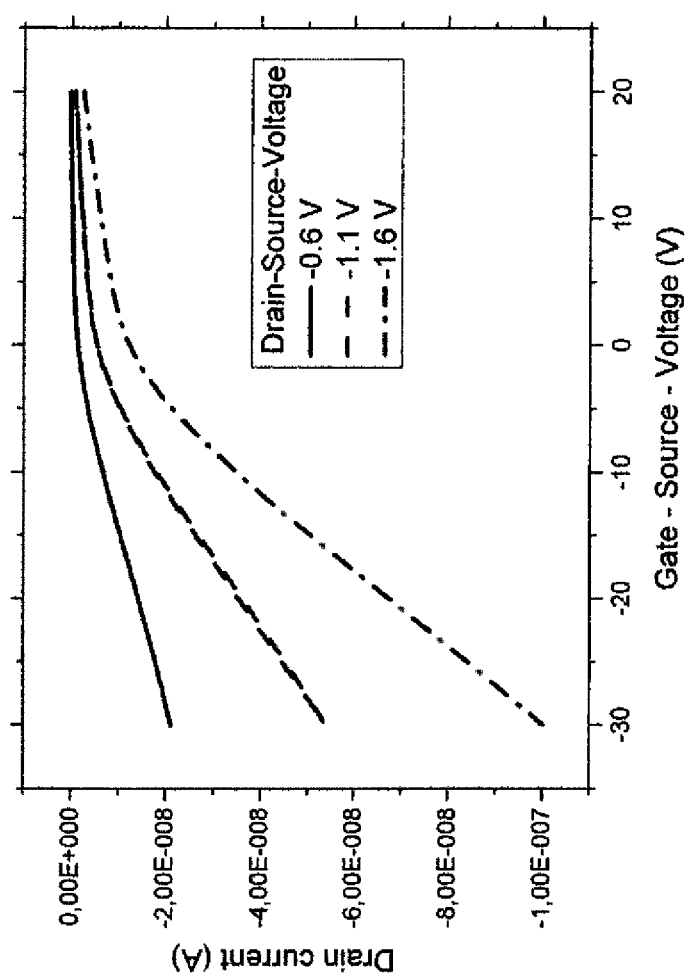
Figure 7:
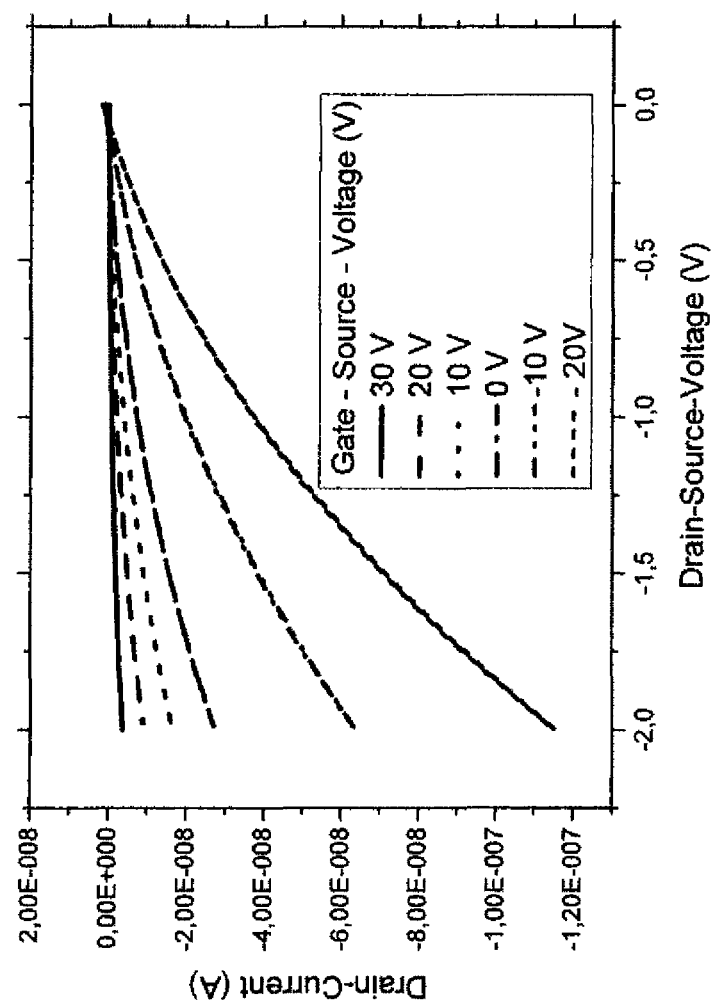
Figure 8:
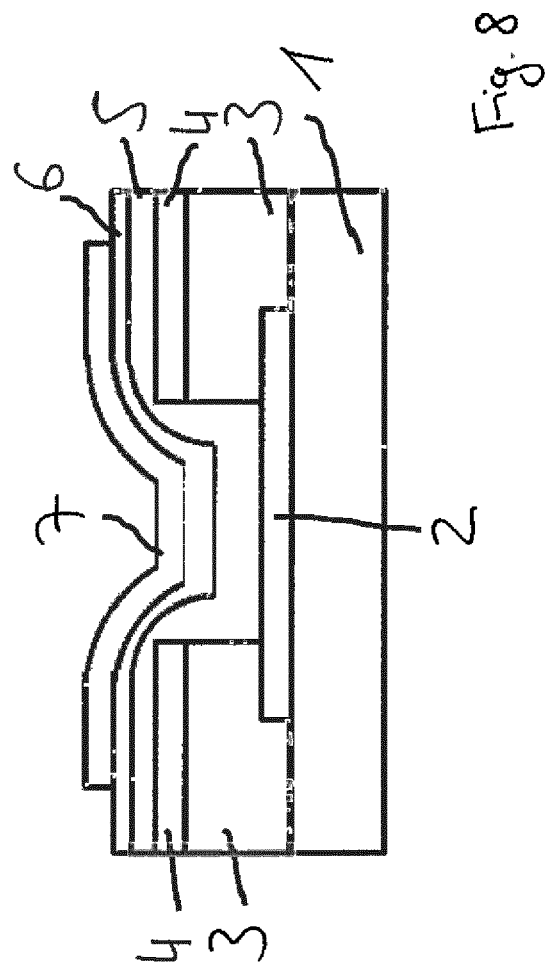
Figure 9:
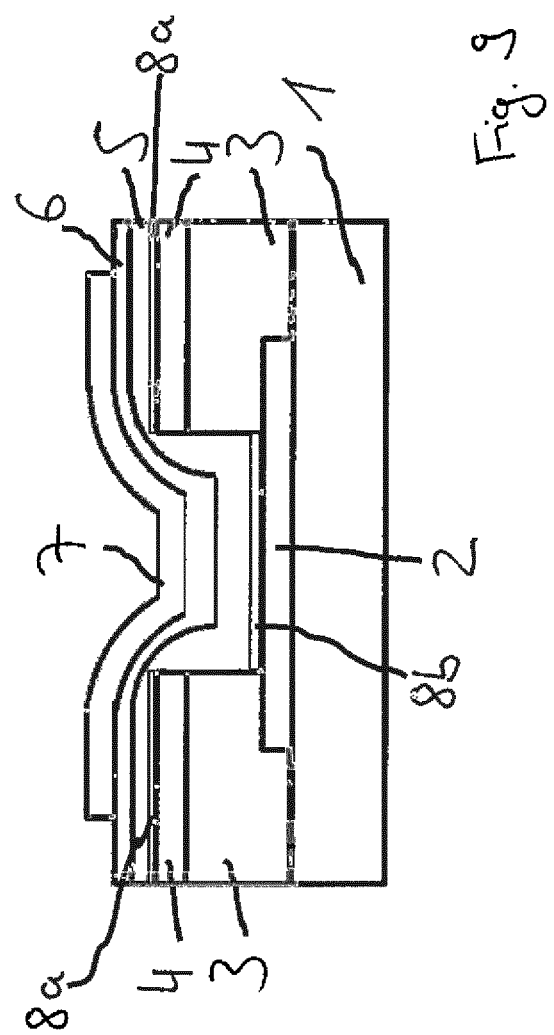
Figure 10:
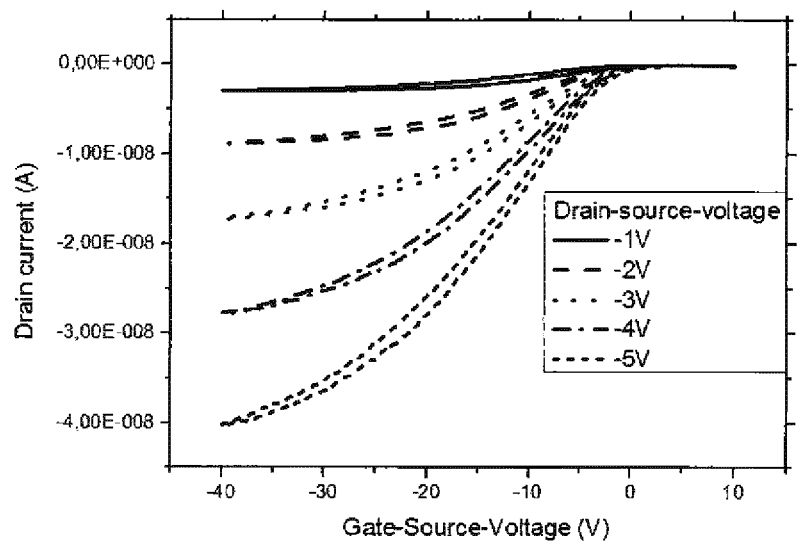
Figure 11:
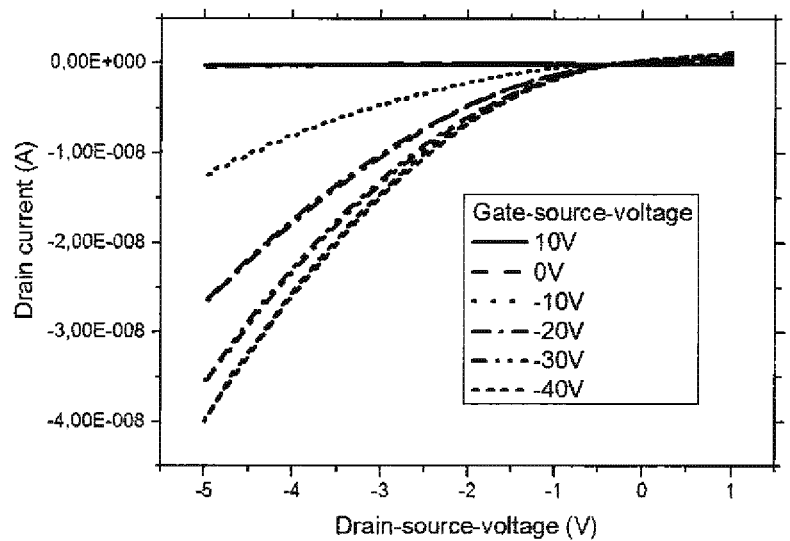
Figure 12:
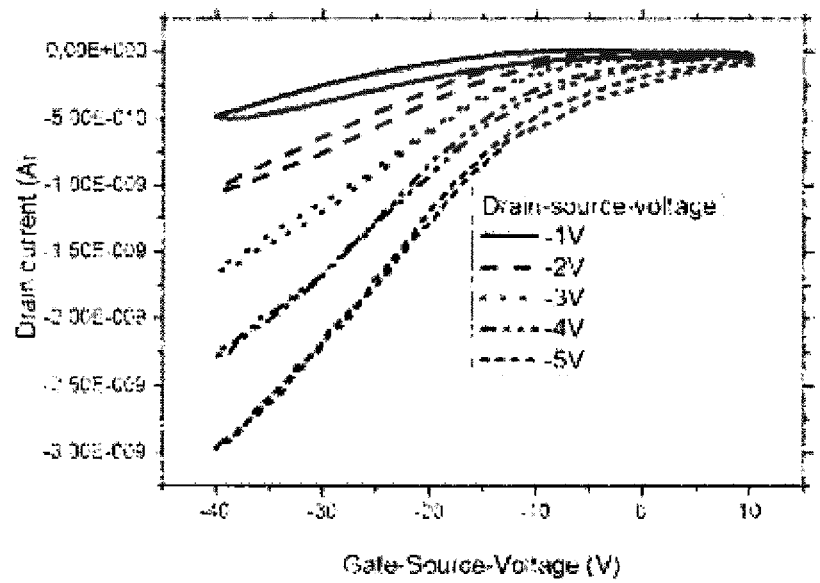
Figure 13:
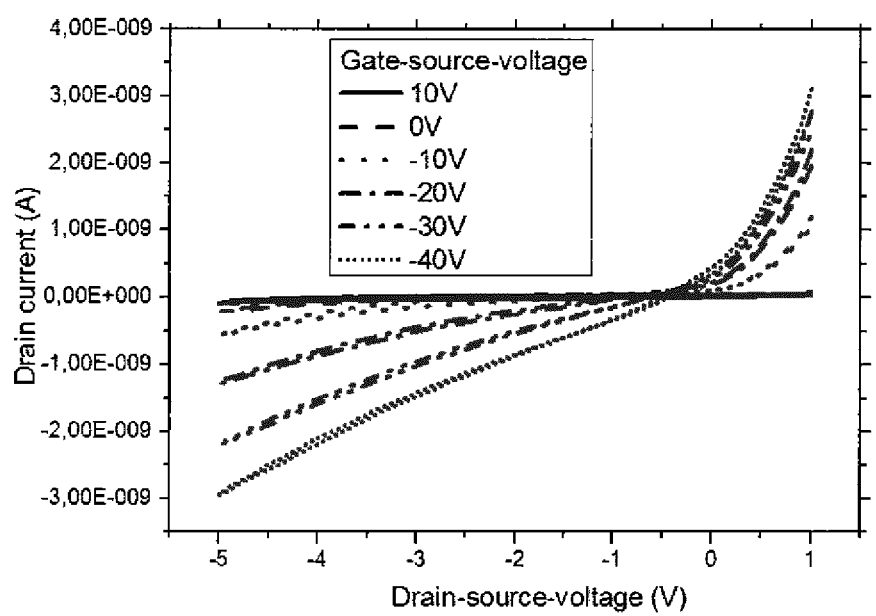

In the following, exemplary embodiments will be further described. In the figures show:

FIG. 1 a schematic representation of a vertical organic thin-film transistor,

FIG. 2 a schematic representation of another vertical organic thin-film transistor, FIG. 3 a schematic representation of another vertical organic thin-film transistor, FIG. 4 a schematic representation of another vertical organic thin-film transistor, FIG. 5 a schematic representation of an electrode configuration, FIG. 6 a transfer characteristic line of the vertical organic thin-film transistor according to FIG. 3, FIG. 7 a current-voltage output curve of the vertical organic thin-film transistor according to FIG. 3, FIG. 8 a schematic representation of another vertical organic thin-film transistor, FIG. 9 a schematic representation of another vertical organic thin-film transistor, FIG. 10 a transfer characteristic line of the vertical organic thin-film transistor according to FIG. 3, FIG. 11 a current-voltage output curve of the vertical organic thin-film transistor according to FIG. 3, FIG. 12 a transfer characteristic line of the vertical organic thin-film transistor according to FIG. 3, and FIG. 13 a current-voltage output curve of the vertical organic thin-film transistor according to FIG. 3.

In the following, like reference signs are used for like components.

FIG. 1 shows a schematic representation of a vertical organic thin-film transistor which comprises several layers. The transistor comprises a substrate 1 on which a first electrode 2 is deposited. The source-drain insulator 3 and the second electrode 4 are arranged on the first electrode 2. An organic semiconductor layer 5 is deposited onto the second electrode 4, the source-drain insulator 3, and the first electrode 2. The gate insulator 6 is coated on the organic semiconductor layer 5. On top of the gate insulator 6 a gate electrode 7 is deposited.

FIG. 2 shows a schematic representation of another transistor design. The transistor comprises also the first electrode 2 with the source-drain insulator 3 and the second electrode 4. Further on top of the second electrode 5 a second-electrode layer 8a and on top of the first electrode 2 a first-electrode layer 8b are provided. The second-electrode layer 8a and/or the first-electrode layer 8b may improve charge injection or may contain a dopant material. An organic semiconductor layer 5 is deposited onto the injection improving layer or dopant layer 8a, 8b electrode 4, the source-drain insulator 3, and the first electrode 2. The gate insulator 6 is coated on the organic semiconductor material 5. On top of the gate insulator 6 a gate electrode 7 is deposited.

FIG. 3 shows a schematic representation of a further embodiment of the vertical organic thin-film transistor which comprises several layers. The transistor comprises a substrate 1 on which a first electrode 2 is deposited. The source-drain insulator 3 and the second electrode 4 are arranged on the first electrode 2. The first and the second electrode 2, 4 are partially overlapping. An organic semiconductor layer 5 is deposited onto the second electrode 4, the source-drain insulator 3, and the first electrode 2. The gate insulator 6 is coated on the organic semiconductor layer 5. On top of the gate insulator 6 a gate electrode 7 is deposited.

FIG. 4 shows a schematic representation of another transistor design. The transistor comprises also the first electrode 2 with the source-drain insulator 3 and the second electrode 4. Further on top of the second electrode 5 a second-electrode layer 8a and on top of the first electrode 2 a first-electrode layer 8b are provided. The second-electrode layer 8a and/or the first-electrode layer 8b may improve charge injection or may contain a dopant material. The first and the second electrode 2, 4 are partially overlapping. An organic semiconductor layer 5 is deposited onto the injection improving layer or dopant layer 8a, 8b electrode 4, the source-drain insulator 3, and the first electrode 2. The gate insulator 6 is coated on the organic semiconductor material 5. On top of the gate insulator 6 a gate electrode 7 is deposited.

FIG. 5 shows a schematic representation of an electrode configuration. The first electrode 9 (e.g. the drain electrode) is provided with first sub-electrode portions 11 and the second electrode 10 (e.g. the source electrode) is provided with second sub-electrode portions 12. The plurality of sub-electrode portions are arranged in separated groups of overlapping sub-electrode portions. Each of the separated groups of overlapping sub-electrode portions comprises at least one first sub-electrode portion overlapping with at least one second sub-electrode portion. The width of the first sub-electrode portions is optimized to be as small as possible to obtain the lowest possible capacitance between the first and second electrode 9, 10 but large enough to collect the current which is limited by the mobility of the charge carriers. Preferable ranges are between 100 µm and 1 µm or between 50 µm and 1 µm or between 20 and 0.5 µm. Preferentially, the sub-electrode portions 11, 12 are parallel to the each other (intra and inter-electrodes parallelism), because that leads to the lowest series resistance and highest overlap length (active area). The doping material layer or the injection improving layer can be at least partially arranged on the sub-electrode portions 11, 12, respectively (not shown).

Following, a method for producing a transistor is disclosed. At first, a first electrode 2 made of a conductive material e.g. a metal is provided on a substrate 1. Typical substrate materials are siliconoxide, glass, polyethylene, other common polymers for foils, first electrode materials are materials: silicon, ITO, Pedot:PSS, Al, all air stable metals like Mo, Ta, Ag, Au, Cu, Al, Pa, Pl, or carbon nanotubes or graphene. The first electrode 2 may be doped. The geometry of the first electrode can be defined by several methods e.g. by shadow mask deposition, printing, or photo-lithography. Preferred methods to define the first electrode are lift-off or etching procedures. In case of a lift-off process, a layer of photo-resist is coated on the substrate, exposed and developed. The first electrode material is deposited onto the resist pattern covering the substrate partially through the resist mask. The spare first electrode material is removed by lifting the photoresist. An etching procedure includes the deposition of the first electrode material, the coating of photoresist, the exposure step, development, etching of the first electrode material and stripping of the resist.

After defining the first electrode, the source-drain insulator 3 and the second electrode 4 are prepared. The source-drain insulator can be a metal oxide, a semi-metal oxide, a polymer or a small molecule organic material. Also organic or inorganic diodes are suited as insulators. It can be deposited by atomic layer deposition, sputtering, thermal deposition, spin-coating or printing. The second electrode might consist of silicon, ITO, Pedot:PSS, Al, all air stable metals like Mo, Ta, Ag, Au, Cu, Al, Pa, Pl, carbon nanotubes, graphene. The second electrode 4 may be doped. The geometry of the source-drain insulator and the second electrode can be defined by several methods e.g. by shadow mask deposition, printing, or photo-lithography.

Preferred methods to define the source-drain insulator and the second electrode are lift-off or etching procedures. In case of a lift-off process, a layer of photo-resist is coated on the substrate with the first electrode, exposed and developed. The source-drain insulator and second electrode materials are deposited onto the resist pattern covering the substrate and the first electrode partially through the resist mask. The spare source-drain insulator and second electrode materials are removed by lifting the photoresist. An etching procedure includes the deposition of the source-drain insulator material, the deposition of the second electrode material, the coating of photoresist, the exposure step, development, etching of the source-drain insulator and second electrode material and stripping of the resist. In one embodiment, the material for the first electrode, the source-drain insulator and the source electrode are chosen to act as selective etch-stop-layer during the etching test. In particular, the etching reaction of the second electrode is not affecting the source-drain insulator and accordingly the first electrode and the etching of the second insulator is not affecting the first electrode.

Following to the step of defining the first electrode, the source-drain insulator, and the second electrode, the injection improving layer or the dopant layer is provided 8a, 8b. Prior to this treatment a cleaning of the sample might be required. The dopant material can be deposited by thermal vacuum deposition. Preferred dopant compounds for the dopant layer are F4-TCNQ or F6-TCNNQ. The dopant layer might also be coated from solution. An injection improving layer based on self-assembling materials is an alternative to the dopant layer.

After the deposition of the dopant layer or the injection improving layer, the organic semiconductor layer 5 is deposited. The organic semiconductor material can be deposited by spin-coating, thermal vacuum deposition, or printing. Patterning techniques such as shadow mask deposition, printing, photo-lithography, and laser ablation can be applied for structuring the organic semiconductor material.

The gate insulator material 6 is deposited onto the organic semiconductor material. It can be deposited by spin-coating, sputtering, printing, atomic layer deposition (ALD) or thermal vacuum deposition. Materials for the gate insulator can be polymers (e.g. fluoropolymers, CYTOP (Asahi Glass Cooperation), PVA polyphenylalcohol, TTC tetratetracontane) or metal and semi-metal oxides (e.g. Al2O3, SiO2, HfO2, TiO2, Si3N4, Ta2O5). Also hydrid stacked gate insulator comprising a double layer of a polymer and a metal or semi-metal oxide can be applied. Patterning techniques such as shadow mask deposition, printing, photo-lithography, and laser ablation can be applied for structuring the gate insulator material.

The gate electrode 7 is deposited following to the gate insulator 6. Typical materials are ITO, Pedot:PSS, Al, all air stable metals like Mo, Ta, Ag, Au, Cu, Al, Pa, Pl, carbon nanotubes, graphene. The geometry of the gate electrode can be defined by several methods e.g. by shadow mask deposition, printing, laser ablation, or photo-lithography. Preferred methods to define the gate electrode are lift-off or etching procedures. In case of a lift-off process, a layer of photo-resist is coated on the gate insulator, exposed and developed. The gate electrode material is deposited onto the resist pattern covering the gate insulator partially through the resist mask. The spare gate electrode material is removed by lifting the photoresist. An etching procedure includes the deposition of the gate material, the coating of photoresist, the exposure step, development, etching of the drain material and stripping of the resist.

In one example, a glass substrate is used as substrate. The substrate is cleaned with acetone, ethanol, and isopropanol (IPA) in a supersonic bath for 5 min and further ozone plasma etching for 10 min. A thin layer of Chromium or Titanium (2 nm) is deposited on the entire substrate followed by a layer of Gold (30 nm). The Chromium or Titan provides an improved adhesion of the Au to the glass substrate. In a first lithography step a layer of AZ NLOF 2020 (Micro-Chemicals, (30 s, 3000 rpm)) is spin-coated on the substrate. The sample is heated at 110° C. for 1 min and following to that exposure to Mercury UV light for 12.5 s. A commercial mask aligner system is used to define the first electrode pattern. After exposure the sample is baked for 1 min at 110° C. and finally developed in TMAH for 90 s. The Gold is etched e.g. by KI2 (Standard etchant Gold, Aldrich) or a mixture of HNO3 and HCl (1:3) for 15 s. The Chromium or Titanium is etched by a mixture of water, perchloracid, and ammoniumcernitrate (($NH_4)_2[Ce(NO_3)_6]$) (mixture ratio (85%:4%:11%) for 15 s. Following to each etching step the sample is rinsed with deionized water and dried with nitrogen. In order to remove the spare photoresist protecting the electrode, the sample is dipped in NMP (N-Methyl-2-pyrrolidon) for 15 min. The photoresist is processed under yellow light (lithography room), at 22° C. The etching is done also at 22° C. Using a mask aligner (finger grid, finger length 400 μm, lateral dimensions are 30 and 50 μm), sample is exposed (e.g. to a Mercury lamp i-line (365 nm), dose 35 mJ/cm$^2$) for forming the drain electrode as shown in FIG. 3.

For the source-drain insulator and second electrode a layer of silicon dioxide and Cr/Au are chosen, respectively. A 100 nm thick layer of SiO2 is deposited onto the substrate with the first electrode by RF-sputtering. In a second step a thin layer of Chromium or Titanium (2 nm) is deposited on the SiO2 followed by a layer of Gold (30 nm). The Chromium or Titan provides an improved adhesion of the Au to the SiO2. In a second lithography step a layer of AZ NLOF 2020 (MicroChemicals, (30 s, 3000 rpm)) is spin-coated on the substrate. The sample is heated at 110° C. for 1 min and following to that exposure to Mercury UV light for 16 s. A commercial mask aligner system is used to define the second electrode pattern. After exposure the sample is baked for 1 min at 110° C. and finally developed in TMAH for 90 s. The Gold is etching e.g. by KI2 (Standard etchant Gold, Aldrich) or a mixture of HNO3 and HCl (1:3) for 15 s. The Chromium or Titanium is etched by a mixture of water, perchloracid, and ammoniumcernitrate (($NH_4$)$_2$[Ce($NO_3$)$_6$]) (mixture ratio (85%:4%:11%) for 15 s. The SiO2 is etched by hydrogenfluoride (HF, 48%) dilute in deionized-water (1:10) for 1 min. Following to each etching step the sample is rinsed with deionized water and dried with nitrogen. In order to remove the spare photoresist protecting the electrode, the sample is dipped in NMP (N-Methyl-2-pyrrolidon) for 15 min. The photoresist is processed under yellow light (lithography room), at 22° C. The etching is done also at 22° C. Using a mask aligner (finger grid, finger length 400 μm, lateral dimensions are 30 and 50 μm), sample is exposed (e.g. to a Mercury lamp i-line (365 nm), dose 35 mJ/cm$^2$) for forming the drain electrode as shown in FIG. 3.

After the definition of the second electrode, the source-drain insulator and the first electrode the sample is cleaned with acetone, ethanol, and isopropanol (IPA) for 5 min and further ozone plasma etched for 10 min.

Following the cleaning step the sample is dipped in PFBT dissolved in PGMEA (1 mM solution) for 5 min and finally rinsed with pure PGMEA. The sample is heated afterwards for 15 min at 40° C. in a nitrogen glovebox. The deposition of a thin layer of e.g. F6-TCNNQ onto the substrate is an alternative to the PFBT treatment. After the treatment of the electrode a 100 nm thick layer of pentacene is deposited by thermal vacuum evaporation.

In order to prepare the gate insulator a thin layer of Cytop (Asahi Glass Cooperation, CYTOP 809M, dissolved to 2 wt % in the solvent Solv. 1800) is spin-coated on the organic material yielding a thickness of 70 nm (10 s at 500 rpm, 20 s at 2000 rpm). This procedure is repeated three times in order to obtain a 210 nm thick film of Cytop. The sample is heated after each coating step for 2 min at 120° C. and after the last step at 120° C. for 30 min.

In a third photolithographic step the gate electrode is defined. A thin layer of Gold (30 nm) is deposited. A layer of AZ NLOF 2020 (MicroChemicals, (30 s, 3000 rpm)) is spin-coated on the Au layer. The sample is heated at 110° C. for 1 min and following to that exposure to Mercury UV light for 12.5 s. A commercial mask aligner system is used to define the gate electrode pattern. After exposure the sample is baked for 1 min at 110° C. and finally developed in TMAH for 90 s. The Gold is etching e.g. by KI2 (Standard etchant Gold, Aldrich) or a mixture of HNO3 and HCl (1:3) for 15 s. Following the etching step the sample is rinsed with deionized water and dried with nitrogen. In order to remove the spare photoresist protecting the electrode, the sample is dipping in NMP (N-Methyl-2-pyrrolidon) for 15 min. The photoresist is processed under yellow light (lithography room) at 22° C. The etching is done also at 22° C.

In another example, a glass substrate is used as substrate. The substrate is cleaned with acetone, ethanol, and isopropanol (IPA) in a supersonic bath for 5 min and further ozone plasma etching for 10 min. The substrate is treated with a solution of deionized water (0.5 ml), ethanol (10 ml) and MPTMS ((3-mercaptopropyl)-trimethoxy-silane, 0.1 ml). The solution is dispensed on the substrate for 1 min and afterward spinrinsed with pure Ethanol and dried on a hotplate for 5 min at 110° C. Afterwards a layer of Gold (20 nm) is deposited on the substrate. The MPTMS improves adhesion of the Au to the glass substrate. In a first lithography step a layer of AZ 1518 (MicroChemicals, (60 s, 1500 rpm)) is spin-coated on the substrate. The sample is heated at 100° C. for 2 min and following to that exposure to Mercury UV light for 8 s. A commercial mask aligner system is used to define the first electrode pattern. After exposure the sample is developed in TMAH for 60 s. The Gold is etched e.g. by KI2 (Standard etchant Gold, Aldrich) or a mixture of HNO3 and HCl (1:3) for 15 s. Following to this etching step the sample is rinsed with deionized water and dried with nitrogen. In order to remove the spare photoresist protecting the electrode, the sample is rinse with Acetone, Ethanol and deionized water 30 s each. The photoresist is processed under yellow light (lithography room), at 22° C. The etching is done also at 22° C.

For the source-drain insulator and second electrode a layer of Cytop and Au are chosen, respectively. A 300 nm thick layer of Cytop is deposited onto the substrate with the first electrode spincoating. For the source-drain insulator a thin layer of Cytop (Asahi Glass Cooperation, CYTOP 809M, dissolved to 2 wt % in the solvent Solv. 1800) is spin-coated on the organic material yielding a thickness of 100 nm (10 s at 500 rpm, 20 s at 2000 rpm). This procedure is repeated three times in order to obtain a 300 nm thick film of Cytop. The sample is heated after each coating step for 2 min at 120° C. and after the last step at 120° C. for 30 min. In a second step a thin layer of Gold (40 nm) is deposited onto the Cytop.

In a second lithography step a layer of AZ NLOF 2020 (MicroChemicals, (30 s, 3000 rpm)) is spin-coated on the substrate. The sample is heated at 110° C. for 1 min and following to that exposure to Mercury UV light for 16 s. A commercial mask aligner system is used to define the second electrode pattern. After exposure the sample is baked for 1 min at 110° C. and finally developed in TMAH for 30 s. The Gold is etching e.g. by KI2 (Standard etchant Gold, Aldrich) or a mixture of HNO3 and HCl (1:3) for 15 s. Following to this etching step the sample is rinsed with deionized water and dried with nitrogen. In order to remove the spare photoresist protecting the electrode, the sample is dipped in NMP (N-Methyl-2-pyrrolidon) for 15 min. The photoresist is processed under yellow light (lithography room), at 22° C. The etching is done also at 22° C. The source-drain insulator of Cytop is etched by reactive ion etching in an oxygen plasma for 1000 s at 200 W. For the plasma etching the second electrode metal can be used as an etching mask. Optionally, also the layer of NLOF 2020 can be used as an etching mask.

If a layer of photoresist such as NLOF 2020 is used as an etching mask for the patterning of the source-drain insulator, the photoresist has to be removed after etching or during the etching. Photoresist can be removed after the etching of the source-drain insulator by solvents like e.g. PGMEA, acetone, or commercial stripper product. The photoresist can also be removed during the etching of the source-drain insulator. In this case the thickness of the resist is preferably the same as the thickness of the source-drain insulator so that both can be etched e.g. by the reactive ion etching simultaneously. This method is preferred since it provides additional protection to the second electrode. If the etching rate of the photoresist and the source-drain insulator are different, the thicknesses have to be modified accordingly.

After the definition of the second electrode, the source-drain insulator and the first electrode the sample is cleaned with isopropanol (IPA) and further ozone plasma etched for 10 min.

After the treatment of the electrode a 100 nm thick layer of pentacene is deposited by thermal vacuum evaporation.

In order to prepare the gate insulator a thin layer of Cytop (Asahi Glass Cooperation, CYTOP 809M, dissolved to 2 wt % in the solvent Solv. 1800) is spin-coated on the organic material yielding a thickness of 70 nm (10 s at 500 rpm, 20 s at 2000 rpm). The sample is heated after each coating step for 2 min at 120° C. and after the last step at 120° C. for 30 min.

In a third photolithographic step the gate electrode is defined. A thin layer of Gold (40 nm) is deposited. A layer of AZ 1518 (MicroChemicals, (30 s, 3000 rpm)) is spin-coated on the Au layer. The sample is heated at 100° C. for 2 min and following to that exposure to Mercury UV light for 8 s. A commercial mask aligner system is used to define the gate electrode pattern. After exposure the sample developed in TMAH for 60 s. The Gold is etching e.g. by KI2 (Standard etchant Gold, Aldrich) or a mixture of HNO3 and HCl (1:3) for 15 s. Following the etching step the sample is rinsed with deionized water and dried with nitrogen. In order to remove the spare photoresist protecting the electrode, the sample is rinse with Acetone, Ethanol and deionized water 30 s each. The photoresist is processed under yellow light (lithography room) at 22° C. The etching is done also at 22° C.

FIG. 6 shows the transfer characteristic of a transistor as shown in FIG. 3 and described above. The ration between ON-current and OFF-current transistors is $10^2$. 100 nm of Pentacene are used as semiconductor material. The first electrode 2 is used as the drain of the transistor and the second electrode 4 is used as the source of the transistor.

FIG. 7 shows the current-voltage output characteristic of a transistor as shown in FIG. 3 and described above. The ration between ON-current and OFF-current transistors is $10^2$. 100 nm of Pentacene are used as semiconductor material. The first electrode 2 is used as the drain of the transistor and the second electrode 4 is used as the source of the transistor.

In another example the first electrode, the source-drain insulator and the second electrode are processed as described in the previous example. Instead of using pentacene as the semiconductor the material TIPS-pentacene (6,13-Bis(triisopropylsilylethynyl)pentacene) is used. This semiconductor is spincoated from solution of TIPS-pentacene and toluene (2 wt. %) and heated afterwards at 100° C. for 2 min. The thickness of the TIPS-pentacene is 50 nm. In the next step the gate insulator material (Cytop) is coated onto the TIPS-pentacene as described above. The thickness of the second insulator (gate insulator) is 300 nm. Instead of TIPS-pentacene also polymers such as P3HT (poly(3-hexylthiophene-2,5-diyl)) can be used as a semiconductor material. The coating of the semiconductor and the organic gate insulator from solution can be done by spin-coating, inkjet printing, or dipping.

Preferably, the semiconductor thickness is equal to or less than 100 nm, more preferably equal to or less than 50 nm.

In the upper examples the source-drain insulator is patterned by either wet or dry etching. Preferably, the edge of the source-drain insulator is perpendicular/orthogonal to the first and second electrode plane. This can be achieved by anisotropic etching of the source-drain insulator. An isotropic etching of the source-drain insulator leading to a more tilted flank (either an undercut (angle between first electrode and edge is significantly smaller than 90°) or a positive flank (angle between first electrode and edge is significantly larger than 90°)) is not desired since it would lead to either additional leakage currents or an extended channel length of the transistor.

In FIG. 8 a vertical organic transistor is shown where the source-drain insulator 3 edge is orthogonal to the first and second electrode 2, 4 plane. This edge profile can be achieved by anisotropic etching. If the organic semiconductor (e.g. P3HT or TIPS-pentacene) and the gate insulator material are coated from solution as e.g. by spin-coating, inkjet printing or dipping, the thicknesses of the semiconductor material and the gate insulator are not uniform across the transistor device. Due to the perpendicular edge of the source-drain insulator 3 the thickness of the semiconductor and the second insulating material is smaller at the source-drain insulator edge.

For thin-film transistors such as organic thin-film transistors it is known to the skilled in the art that a high on/off ratio of a transistor and a good saturation of drain current can be achieved if the length of the transistor is at least five times the dielectric thickness of the gate insulator.

In a vertical transistor processed as described above and as shown in FIG. 8, however, the length of the channel is given by the thickness of the source-drain insulator 3. Hence, following the rules for thin-film transistor the thickness of the source-drain insulator 3 has to be at least five times the thickness of the gate insulator 6.

For devices having a thickness of the second insulator of 220 nm (device shown in FIGS. 3 and 4), the thickness of the source-drain insulator should be at least 1100 nm. However, the thickness of the source-drain insulator 3 of the devices shown in FIGS. 3 and 4 is merely 200-300 nm. Hence, a sufficient on/off ratio can be achieved even if the nominal thickness of the source-drain insulator (equivalent to the channel length) is the same as the thickness of the second insulator. This behavior is related to the perpendicular edges of the source-drain insulator and the non-conformal coating of the semiconductor material and the second insulator material.

The ratio of source-drain insulator thickness to the second insulator (gate insulator) thickness of 1:1 represents a preferred situation since the small thickness of the source-drain insulator ensures a high on-current while the comparably thick second insulator ensures a high yield of the transistor. If the source-drain insulator would be significantly thicker than the second insulator, the on-current would be reduced and the yield of the devices would be lower because of a high risk of short cuts to the gate electrode. If the source-drain insulator is would be significantly thinner, the risk for short cuts between source and drain would be larger and moreover, the on/off ratio of the transistor would be smaller.

In FIG. 9 a vertical organic transistor is shown where the source-drain insulator 3 edge is orthogonal to the first and second electrode 2, 4 plane. This edge profile can be achieved by anisotropic etching. The first and the second electrode 2, 4 are covered by the first-electrode and second-electrode layer 8a, 8b, respectively. The semiconductor layer 5 and the gate insulator 6 are coated from solution.

FIG. 10 shows the transfer characteristic of a transistor as shown in FIG. 3 and described above. The ratio between ON-current and OFF-current transistors is $10^3$. 80 nm of Tips-Pentacene are used as semiconductor material. The first electrode 2 is used as the drain of the transistor and the second electrode 4 is used as the source of the transistor.

FIG. 11 shows the current-voltage output characteristic of a transistor as shown in FIG. 3 and described above. The ratio between ON-current and OFF-current transistors is $10^3$. 80 nm of Tips-Pentacene are used as semiconductor material. The first electrode 2 is used as the drain of the transistor and the second electrode 4 is used as the source of the transistor.

FIG. 12 shows the transfer characteristic of a transistor as shown in FIG. 3 and described above. The ratio between ON-current and OFF-current transistors is $10^3$. 80 nm of Tips-Pentacene are used as semiconductor material. The second electrode 4 is used as the drain of the transistor and the first electrode 2 is used as the source of the transistor.

FIG. 13 shows the current-voltage output characteristic of a transistor as shown in FIG. 3 and described above. The ratio between ON-current and OFF-current transistors is $10^3$. 80 nm of Tips-Pentacene are used as semiconductor material. The second electrode 4 is used as the drain of the transistor and the first electrode 2 is used as the source of the transistor.

The features disclosed in the specification, the claims and the figures can be relevant for the invention either alone or in any combination with each other.

In the following, a list of the abbreviations for the materials mentioned above is provided:
 AZ NLOF 2020 is a trade name of a commercial negative tone photoresist.
 AZ 1518 is a trade name of a commercial positive tone photoresist.
 PGMEA is Propylene glycol monomethyl ether acetate, a solvent for AZ NLOF2020 and AZ 1518.
 TMAH is Tetramethylammoniumhydroxide, a developer for AZ 1518 and AZ NLOF 2020.
 KI2 is Potassium-Iodine, a standard-etchant for Gold.
 Cytop is Fluoropolymer from Asahi-Glass-Corporation.
 PFBT is Pentafluorobenzothiol, an injection material.

The invention claimed is:

1. A method for producing an organic transistor, the method comprising the steps of:
 providing a first electrode on a substrate,
 generating a source-drain insulator assigned (i) at least partially to the substrate, (ii) at least partially to the first electrode, or (iii) at least partially to the substrate and at least partially to the first electrode,
 generating a second electrode assigned to the source-drain insulator,
 depositing an organic semiconducting layer on the first electrode, the second electrode, and the source-drain insulator,
 generating a gate insulator assigned to the organic semiconducting layer, and
 providing a gate electrode assigned to the gate insulator;
 wherein the method further comprises the following steps—
 (a) generating a second-electrode layer assigned to the second electrode prior to depositing the organic semiconducting layer such that the second electrode is at least partially covered by the second-electrode layer, wherein the second-electrode layer is a doping layer comprising a dopant material, and
 (b) generating a first-electrode layer assigned to the first electrode prior to depositing the organic semiconducting layer such that the first electrode is at least partially covered by the first-electrode layer, wherein the first-electrode layer is a further doping layer comprising a further dopant material; and
 wherein the dopant material and the further dopant material comprise one or more different materials.

2. The method according to claim 1, wherein (a) the second-electrode layer, (b) the first-electrode layer, or (c) the second-electrode layer and the first-electrode layer are generated by physical vapour deposition.

3. The method according to claim 1, wherein (a) the second-electrode layer, (b) the first-electrode layer, or (c) the second-electrode layer and the first-electrode layer are generated by solution processing.

4. The method according to claim 1, wherein at least one of the following steps comprises a step of photo-lithographic structuring:
 the step of providing the first electrode,
 the step of generating the source-drain insulator,
 the step of generating the second electrode,
 the step of generating the second-electrode layer,
 the step of generating the first-electrode layer,
 the step of generating the gate insulator, and
 the step of providing the gate electrode.

5. The method according to claim 1, wherein the first electrode is generated with first sub-electrode portions and the second electrode is generated with second sub-electrode portions, the first sub-electrode portions and the second sub-electrode portions being arranged in separated groups of overlapping first sub-electrode portions and the second sub-electrode portions, wherein each of the separated groups of overlapping first sub-electrode portions and the second sub-electrode portions is generated with at least one first sub-electrode portion overlapping with at least one second sub-electrode portion.

6. The method according to claim 1, wherein the step of providing the first electrode comprises the steps of:
 depositing a first conductive layer,
 depositing a first photoresist layer,
 defining an electrode area for the first electrode by patterning the first photoresist layer, thereby providing a first photoresist pattern,
 etching the first conductive layer, and
 removing the first photoresist pattern by a stripping process, thereby generating the first electrode.

7. The method according to claim 1, wherein the steps of generating the source-drain insulator and the second electrode comprise the steps of:
 depositing a first insulating layer and a second conductive layer,
 depositing a second photoresist layer,
 defining an electrode area for the second electrode by patterning the second photoresist layer, thereby providing a second photoresist pattern,
 etching the second conductive layer,
 etching the first insulating layer, thereby generating the source-drain insulator,
 removing the second photoresist pattern by a stripping process, thereby generating the second electrode.

8. The method according to claim 1, wherein the steps of generating the source-drain insulator and the second electrode comprise the steps of:
 depositing a first insulating layer and a second conductive layer,
 depositing a second photoresist layer,
 defining an electrode area for the second electrode by patterning the second photoresist layer, thereby providing a second photoresist pattern,
 etching the second conductive layer, etching the first insulating layer and the second photoresist pattern, thereby generating the source-drain insulator and the second electrode.

9. The method according to claim 1, wherein the steps of generating the gate insulator and providing the gate electrode comprise the steps of:

depositing a second insulating layer, thereby generating the gate insulator, depositing a third conductive layer on the organic semiconducting layer, depositing a third photoresist layer, defining an electrode area for the gate electrode by patterning the third photoresist layer, thereby providing a third photoresist pattern, etching (a) the second insulating layer, (b) the third conductive layer, or (c) the second insulating layer and the third conductive layer, and removing the third photoresist pattern by a stripping process, thereby generating the gate electrode.

10. The method according to claim 1, wherein the step of generating the source-drain insulator comprises an anisotropic etching step.

11. The method according to claim 1, wherein the step of depositing the organic semiconducting layer comprises a deposition from solution.

12. The method according to claim 1, wherein the step of generating the gate insulator layer comprises a deposition from solution.

13. An organic transistor, comprising:
a first electrode on a substrate,
a source-drain insulator assigned (i) at least partially to the substrate, (ii) at least partially to the first electrode, or (iii) at least partially to the substrate and at least partially to the first electrode,
a second electrode assigned to the source-drain insulator,
an organic semiconducting layer arranged on the first electrode, the second electrode, and the source-drain insulator,
a gate insulator assigned to the organic semiconducting layer,
a gate electrode assigned to the gate insulator, and
the following layers—
(a) a second-electrode layer which at least partially covers the second electrode, wherein the second-electrode layer is a doping layer comprising a dopant material, and
(b) a first-electrode layer which at least partially covers the first electrode, wherein the first-electrode layer is a further doping layer comprising a further dopant material; and
wherein the dopant material and the further dopant material comprise one or more different materials.

14. The organic transistor according to claim 13, wherein a source-drain insulator edge is at least substantially orthogonal to the substrate.

15. The organic transistor according to claim 13, wherein the gate insulator is at least substantially as thick as the source-drain insulator.

* * * * *